United States Patent [19]

Hsiao et al.

[11] Patent Number: 4,628,991

[45] Date of Patent: Dec. 16, 1986

[54] WAFER SCALE INTEGRATED CIRCUIT TESTING CHUCK

[75] Inventors: Wen-Ting Hsiao; Hubertus A. Everling, both of San Jose, Calif.

[73] Assignee: Trilogy Computer Development Partners, Ltd., Cupertino, Calif.

[21] Appl. No.: 674,817

[22] Filed: Nov. 26, 1984

[51] Int. Cl.[4] .............................................. B23Q 3/00
[52] U.S. Cl. ................................. 165/80.4; 73/432.1; 165/80.2; 165/168; 165/170; 269/69
[58] Field of Search ..................... 374/57; 73/432 SD; 165/80 R, 80 A, 80 C, 170, 168, 174, 139; 269/69

[56] References Cited

U.S. PATENT DOCUMENTS

| 416,244 | 12/1889 | Weller .................................... 269/69 |
| 1,307,812 | 6/1919 | Errickson ......................... 165/170 X |
| 2,699,325 | 1/1955 | Hedin ................................. 165/168 |
| 3,361,195 | 1/1968 | Meyerhoff et al. .............. 165/139 X |
| 3,708,223 | 1/1973 | Sorensen et al. ................ 165/170 X |
| 3,768,551 | 10/1973 | Wiley et al. ...................... 165/170 X |
| 3,828,606 | 8/1974 | Wolter ............................... 374/57 X |
| 4,282,924 | 8/1981 | Faretra .............................. 165/80 C |
| 4,345,643 | 8/1982 | Dawson et al. .................. 165/170 X |
| 4,386,505 | 6/1983 | Little ................................. 165/168 X |
| 4,390,997 | 7/1983 | Hinz et al. ........................ 165/174 X |
| 4,489,570 | 12/1984 | Little ................................. 165/168 X |
| 4,491,173 | 1/1985 | Demand ......................... 165/80 R X |
| 4,512,391 | 4/1985 | Harra ............................. 165/80 C X |

FOREIGN PATENT DOCUMENTS

| 484273 | 6/1952 | Canada ................................ 165/170 |
| 28239 | 9/1956 | Fed. Rep. of Germany ...... 165/168 |
| 0147478 | 4/1981 | Fed. Rep. of Germany ........ 374/57 |
| 91449 | 6/1959 | Netherlands ......................... 165/168 |

OTHER PUBLICATIONS

"Methods of Measurement for Semiconductor Materials, Process Control and Devices", Nat. Bur. Stand., Washington, D.C. Tech note 495, Sep. 1969.

Primary Examiner—Albert W. Davis, Jr.
Assistant Examiner—Randolph A. Smith
Attorney, Agent, or Firm—Townsend & Townsend

[57] ABSTRACT

A testing chuck for providing a thermally controlled mounting for wafer scale integrated circuits includes a body having a flat upper surface, upon which the integrated circuit is mounted, cooled or heated by a fluid flowing through a number of channels formed in the body. The channels have entrance and exit ends fluidly connected to first entrance and exit plenums. Second entrance and exit plenums are connected to the first entrance and exit plenums by a number of entrance and exit distribution conduits. Fluid is pumped into the second entrance plenum, through the entrance distribution conduits, through the first entrance plenum and into the entrance ends of the channels. After passing through the channels, the fluid flows through the first exit plenum, exit distribution conduits and second exit plenum. The entrance and exit plenums are curved in the direction of fluid flow to reduce stagnant regions within the plenums to aid heat transfer and draining of the chuck. The use of two plenums coupled by appropriately sized and positioned distribution conduits at both ends of the channels ensures that the proper amount of fluid flows through each channel.

13 Claims, 4 Drawing Figures

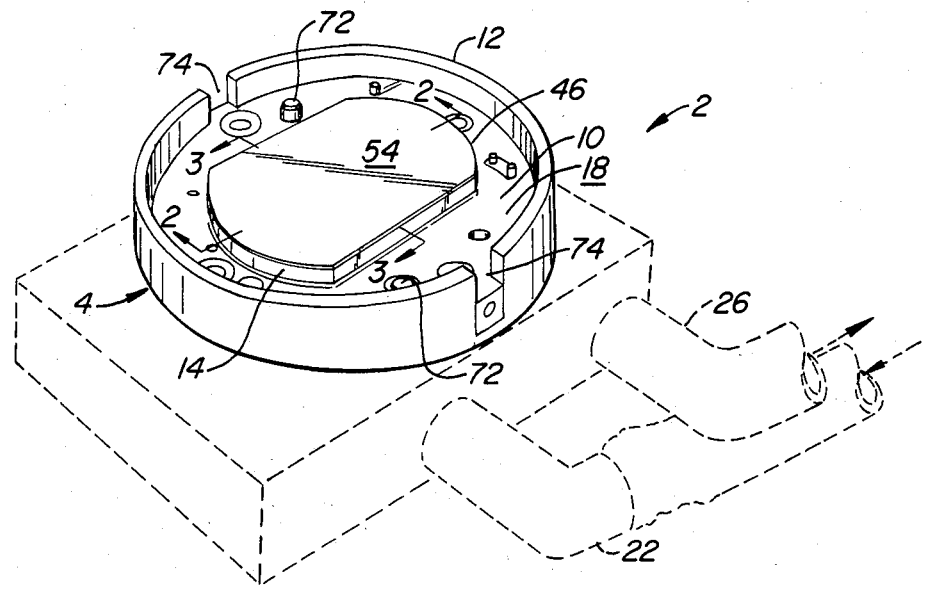
FIG._1.
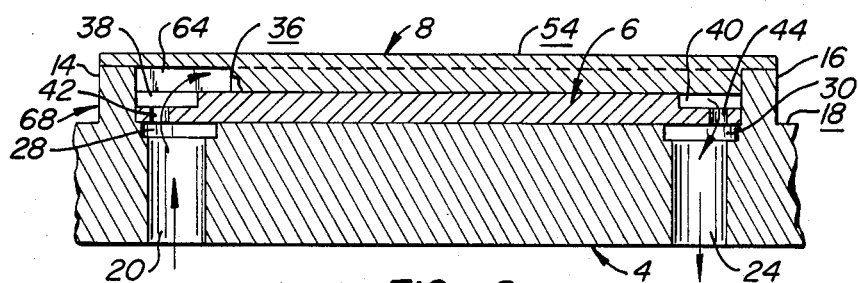
FIG._2.
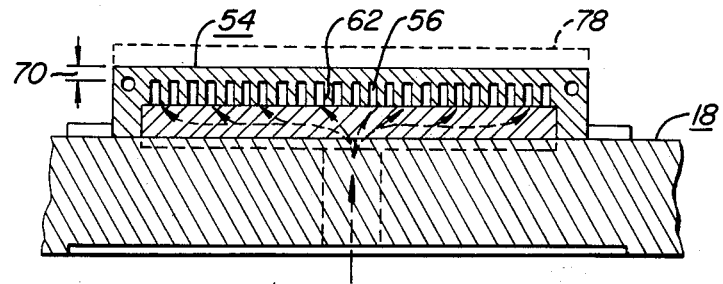
FIG._3.

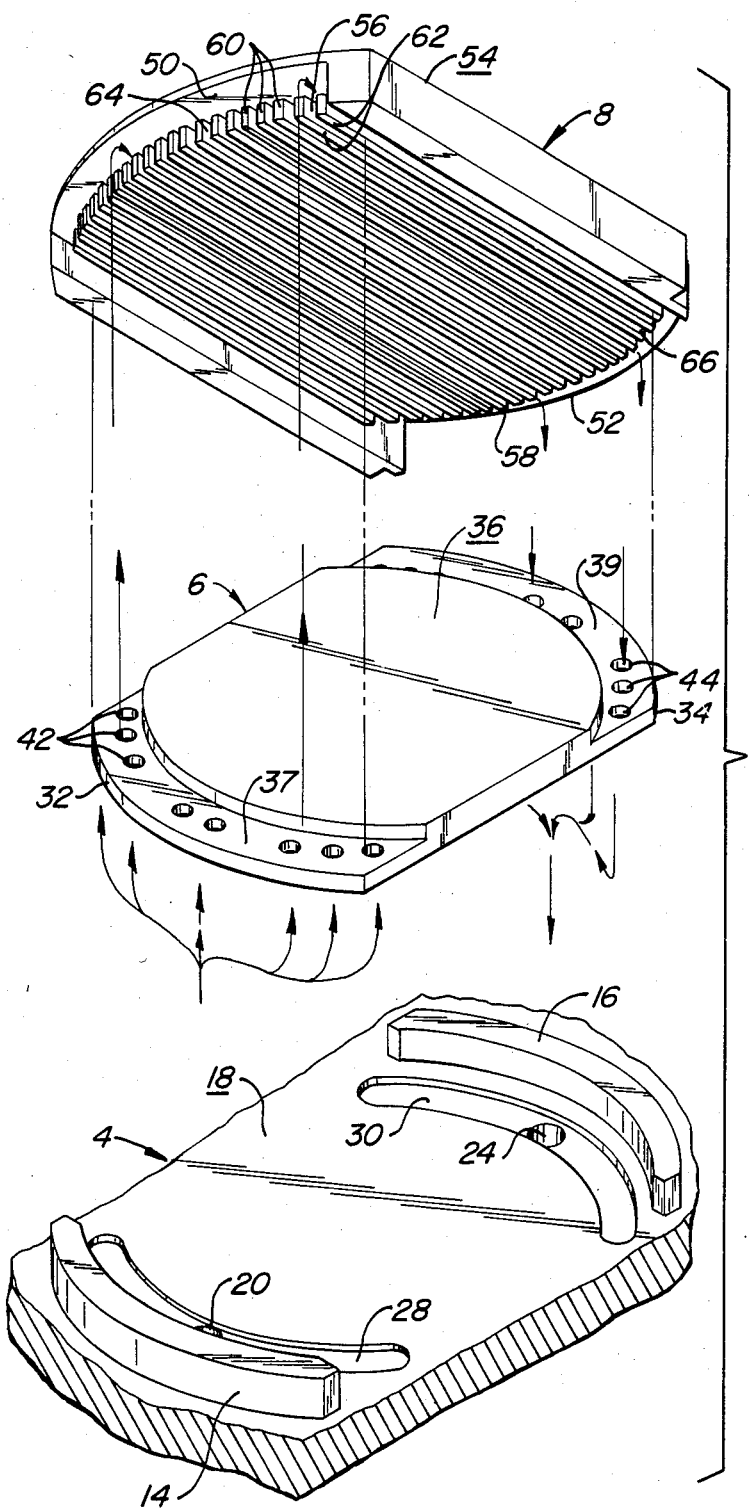
FIG._4.

WAFER SCALE INTEGRATED CIRCUIT TESTING CHUCK

BACKGROUND OF THE INVENTION

The growth of the electronics industry from discrete components, such as individually packaged transistors and diodes, through large-scale integrated circuits is a well-recognized, remarkable development. The next step, for some companies, is to extend the technology to what is known as wafer scale integration. Under this concept, circuitry is formed on a full-size silicon wafer, typically 3–4 inches in diameter, instead of on individual silicon wafer chips, which measure only about ¼ inch on a side. A single wafer scale integrated circuit is expected to replace on the order of 100 large-scale integrated circuits.

One reason for developing wafer scale integration technology is that the number of external hardwire connections is substantially reduced since the hardwire connections which would otherwise be needed between chips are eliminated. Wafer scale integration is expected to reduce the cost of a complex system, increase its reliability and increase its speed.

Because of the great number and density of components in a wafer scale integrated circuit, a substantial amount of heat, for example 1,000 watts, is generated during use. This heat must be properly dissipated to keep the integrated circuit from being destroyed. The heat must be removed both during the normal operation of the integrated circuit and also during its testing.

SUMMARY OF THE INVENTION

The present invention is directed to a testing chuck which provides a thermally controlled mounting surface to which a wafer scale integrated circuit is mounted for testing. The chuck is useful as a cooling chuck during normal operational testing and as an elevated temperature chuck for burn-in testing of the integrated circuits. When used to cool the integrated circuit the chuck is made of a material such as copper with high heat capacity and thermal conductivity, such as copper. When used for burn-in testing a relatively poor thermal conductor, such as stainless steel, is used for the chuck.

The chuck includes a flat upper surface, upon which the integrated circuit is mounted, cooled (or heated) by a fluid passing through number of channels formed beneath the upper surface. The channels underlie a substantial portion of the cooled (or heated) upper surface. The channels have entrance ends fluidly connected to a first entrance plenum. A second entrance plenum is also used and is connected to the first entrance plenum by a number of entrance distribution conduits. The first and second entrance plenums and the entrance distribution conduits are collectively termed the entrance distribution network. The fluid is pumped into to the second entrance plenum, flows through the entrance distribution conduits, through the first entrance plenum and into the entrance ends of the channels. After passing through the channels, the fluid flows out through an exit distribution network, typically including a first exit distribution plenum, exit distribution conduits and a second exit plenum.

A primary feature of the present invention is its use of two entrance plenums connected by a number of strategically placed distribution conduits to assure that the fluid is supplied in the proper amounts through all the channels. With the present invention, the chuck has been designed so that the same amount of fluid flows through each of the channels. However, if desired or required, the entrance and exit distribution networks may be designed to supply more fluid through some channels than other channels.

The entrance and exit plenums are curved in the direction of fluid flow to reduce stagnant regions within the plenums. This promotes the proper flow of the fluid by keeping the fluid from becoming trapped in a corner of the plenums. Cooling (and heating) effectiveness and draining of the chuck are aided by this feature of the invention.

Another feature of the invention is that the channels are formed integrally within the cover, the cover having the flat mounting surface against which the integrated circuit is mounted during normal operational testing when the chuck is used to cool the integrated circuit. This eliminates surface junctions which would hinder heat flow from the cooled upper surface to the cooling fluid within the cooling channels thus enhancing efficiency. During burn-in testing, for which the chuck is preferably made of poor thermal conductor such as stainless steel, a thin (e.g. ¼ inch) copper shim may be used over the outer surface of the cover to help eliminate hot spots.

Other features and advantages of the present invention will appear from the following description in which the preferred embodiment has been set forth in detail in conjunction with the accompanying drawings.

BRIEF DESCRIPTION OF THE DRAWINGS

FIG. 1 is a perspective view of the chuck of the invention shown supported by a fluid supply base illustrated by dashed lines.

FIG. 2 is a cross-sectional view taken along line 2—2 of FIG. 1.

FIG. 3 is a cross-sectional view taken along line 3—3 of FIG. 1 and illustrating the copper shim, used for burn-in testing, in dashed lines.

FIG. 4 is an exploded isometric view of the cover, distribution plate and base of FIG. 2.

DETAILED DESCRIPTION OF THE PREFERRED EMBODIMENT

Referring now to the figures, a cooling chuck 2 is shown and includes a base 4, upon which a distribution plate 6 and a cover 8 are mounted. Base 4 includes a disc-like body 10 from which a circular lip 12 extends upwardly at its outer edge. A pair of spaced-apart arcuate flanges 14, 16 extend upwardly from an upper surface 18 of body 10. Plate 6 and cover 8 are mounted between flanges 14, 16. Base 4, plate 6 and cover 8 are made of copper for its good heat transfer characteristics.

Base 4 includes an entrance bore 20 fluidly coupled to a cooling fluid inlet line 22 (FIG. 1) and an exit bore 24 fluidly connected to a cooling fluid outlet line 26. An arcuate base entrance plenum 28 (FIG. 4) is formed within upper surface 18 of base 4 centered directly above and in fluid communication with entrance bore 20. A base exit plenum 30 is formed within upper surface 18 of base 4 centered directly above and in fluid communication with exit bore 24.

Distribution plate 6 is a generally planar member having arcuate ends 32, 34 sized to fit between flanges 14, 16 on top of surface 18 and to cover base entrance and exit plenums 28, 30. The upper surface 36 of plate 6 has a pair of arcuate grooves 37, 39 formed adjacent ends 32, 34 to form distribution plate entrance and exit plenums 38, 40 (FIG. 2). Plenum 38 is fluidly connected to plenum 28 by several entrance distribution conduits 42 which are unevenly spaced along the plenums. Similarly, a number of exit distribution conduits 44 are formed through plate 6 to fluidly connect exit plenums 30, 40. Conduits 42, 44 are chamfered at one end (see FIG. 2) to help lower resistance to fluid flow.

Cover 8 is sized to fit on top of upper surface 36 of distribution plate 6 and is secured to flanges 14, 16 by brazing. Cover 8 has a flat, upper cooled surface 54 upon which the wafer scale integrated circuit is mounted during normal operations testing. A number of elongate, parallel cooling channels 56 (see FIGS. 2 and 3) are formed within cover 56. Cooling channels 56 are separated by downwardly extending fingers 62 which press against upper surface 36 of distribution plate 6. The arcuate ends 58, 60 of fingers 62 abut flanges 14, 16 (FIGS. 2 and 4). Thus a cooling fluid path is formed between entrance and exit bores 20, 24 through plenum 28, distribution conduits 42, and plenum 38, into the entrance ends 64 of cooling channels 56, past the exit ends 66 of channels 56, and through plenum 40, distribution conduits 44, and plenum 30.

The cooling fluid entrance distribution network 68 (which includes plenum 28, conduits 42 and plenum 38) and exit distribution network 70 (including plenum 40, conduits 44 and plenum 30) act to ensure the uniform distribution of cooling fluid through each of the cooling channels 56 so that uniform cooling is achieved over the upper cooled surface 54 of cover 8. The configuration of the plenum 28 and the sizing, positioning and configuration of distribution conduits 42 act to distribute the cooling fluid to plenum 38 much more evenly than would otherwise occur if entrance bore 20 opened directly into plenum 38. Distribution networks 68 and 72 are designed to achieve generally uniform flow volumes through each of the cooling channels 56 for proper cooling of the integrated circuit mounted to surface 54.

Cooling channels 56, in this embodiment, have a width of 1.3 mm with a height of 4 mm. Twenty-four channels 56 are used and a water/antifreeze solution at a temperature preferably below 0° C. is pumped through the channels at a rate of one and a half gallons per minute. Fingers 62 are 4 mm long and 1.6 mm wide. The distance 72 between the top or root of channels 56 and surface 54 is about 1.5 mm. These dimensions have been calculated using conventional heat transfer theory to achieve turbulent flow within channels 56. The laminar flow is not quite as efficient in transferring heat as is turbulent flow. The various factors which determine whether or not the flow will be laminar (cross-section of channel 56, velocity of the cooling fluid and viscosity of the cooling fluid) depend on the cooling requirements. Other sizes, shapes, spacings and configurations for channels 56 can be used as well.

For high temperature burn-in testing, base 4, plate 6 and cover 8 are preferably made of stainless steel, which is a poor conductor of heat compared with copper. The fluid pumped through channels 56 is typically water at a temperature of between 50°-80° C. for the burn-in testing. To eliminate hot spots, which are not desired even during burn-in testing, a copper shim 78, which is about ¼" thick and is illustrated in dashed lines in FIG. 3, is mounted to upper surface 54 using a thermally conductive adhesive.

The cooling chuck 2 made according to the invention has a number of features, such as alignment pins 72 extending from surface 18 and locking slots 74 in lip 12, provided because chuck 2 is designed for use with a wafer scale integrated circuit testing apparatus disclosed in U.S. patent application Ser. No. 618,095, titled "WSI Tester" and filed on June 7, 1984. The disclosure of that application is incorporated by reference. Since these features are not part of this invention, they will not be described.

Modification and variation can be made to the disclosed embodiment without departing from the subject of the invention as defined in the following claims. For example, distribution networks 68, 70 are shown communicating with entrance and exit ends 64, 66 from below. Networks 68, 70, or either of them, may also provide the cooling fluid from other directions, such as from a direction aligned with the length of channels 56. Also, base 4, distribution plate 6 and cover 8 are symmetrical. Although this allows the various components to be assembled without regard to which is the entrance end and which is exit end, such components need not be symmetrical.

What is claimed is:

1. A heat sink for cooling a semiconductor device mounted thereto comprising:
    a heat sink body having a flat upper surface upon which the semiconductor device is mounted;
    said body defining a plurality of straight channels therein, the channels oriented parallel to the upper surface and having entrance and exit ends;
    entrance and exit distribution networks fluidly coupled to the entrance and exit ends, said entrance and exit distribution networks arranged and adapted to achieve a desired flow of a fluid through the channels, said entrance distribution network comprising: a first entrance plenum formed in said heat sink body and fluidly coupled to said entrance ends of said channels for distribution of the fluid to said channels; a second entrance plenum formed in said heat sink body; and a plurality of entrance distribution conduits fluidly coupling said first entrance plenum with said second entrance plenum; and
    first means for directing the fluid to said second entrance plenum;
    second means for directing the fluid from said exit distribution network.

2. The heat sink of claim 1 wherein said exit distribution network includes:
    a first exit plenum fluidly coupled to said channels exit ends;
    a second exit plenum; and
    a plurality of exit distribution conduits fluidly coupling said first exit plenum with said second exit plenum.

3. The heat sink of claim 2 wherein said first and second entrance and exit plenums are arcuately curved in the direction of fluid flow to substantially eliminate stagnant regions within said plenums.

4. The heat sink of claim 2 wherein said heat sink body further comprises:
    a cover defining said flat upper surface;
    a distribution plate underlying said cover, said distribution plate and said cover defining said channels and said first entrance and exit plenums; and wherein said entrance and exit distribution conduits fluidly connect a lower surface of said distribution plate to said first entrance and exit plenums respectively.

5. The heat sink of claim 4 wherein said cover includes:
   a generally planar first member having spaced apart fingers substantially defining said channels on one side and a mounting surface on the opposite side;
   a generally planar shim member mounted to said mounting surface; and
   said shim member having a high thermal conductivity relative to said cover and distribution plate so said heat sink is useful during burn-in testing.

6. The heat sink of claim 5 wherein said shim member is copper and said cover and distribution plate are stainless steel.

7. The heat sink of claim 4 wherein said heat sink body further comprises a base defining said first and second directing means, and wherein an upper surface of said base and the lower surface of said distribution plate define said second entrance and exit plenums.

8. The heat sink of claim 1 wherein said channels underlie a substantial portion of said flat upper surface.

9. The heat sink of claim 1 wherein said entrance distribution conduits are positioned at unequal intervals relative to one another.

10. The heat sink of claim 1 wherein said second entrance plenum underlies said entrance distribution conduits.

11. The heat sink of claim 1 wherein at least a portion of said first directing means underlies said second entrance plenum.

12. The heat sink of claim 1 wherein said heat sink body is copper.

13. A wafer scale integrated circuit testing cooling chuck for providing a thermally controlled mount for the integrated circuit during testing, the chuck comprising:
   a cover defining a flat upper surface upon which the integrated circuit is mounted;
   a distribution plate underlying said cover, said distribution plate and said cover defining a plurality of channels, said channels having entrance and exit ends;
   said distribution plate partially defining first entrance and exit plenums underlying the entrance and exit ends of the channels;
   a base underlying said distribution plate, an upper surface of said base and a lower surface of said distribution plate defining a second entrance plenum and a second exit plenum, said second entrance and exit plenums being disposed directly below said first entrance and exit plenums;
   entrance distribution conduits formed through said distribution plate at unequal intervals and fluidly connecting said first and second entrance plenums;
   exit distribution conduits formed through said distribution plate at unequal intervals and fluidly connecting said first and second exit conduits;
   said first and second entrance and exit plenums being arcuately configured in the direction of flow of a fluid to substantially eliminate stagnant regions within said plenums;
   means for directing the fluid to said second entrance plenum; and
   means for directing the fluid from said second exit plenum.

* * * * *